(12) United States Patent
Liu et al.

(10) Patent No.: US 7,612,600 B2
(45) Date of Patent: Nov. 3, 2009

(54) DC OFFSET CALIBRATION APPARATUS AND METHOD

(75) Inventors: Ren-Chieh Liu, Chang-Hua Hsien (TW); Han-Chang Kang, Taipei Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/968,199

(22) Filed: Jan. 2, 2008

(65) Prior Publication Data
US 2008/0157846 A1 Jul. 3, 2008

(30) Foreign Application Priority Data
Jan. 3, 2007 (TW) .............................. 96100221 A

(51) Int. Cl.
*H03L 5/00* (2006.01)
(52) U.S. Cl. ........................................ 327/307; 327/362
(58) Field of Classification Search ................ 327/306, 327/307, 362, 62, 77
See application file for complete search history.

(56) References Cited

U.S. PATENT DOCUMENTS

| | | | |
|---|---|---|---|
| 6,047,031 A | 4/2000 | Allott | |
| 6,211,716 B1 * | 4/2001 | Nguyen et al. | 327/307 |
| 6,316,992 B1 * | 11/2001 | Miao et al. | 330/2 |
| 6,903,593 B2 | 6/2005 | Wang | |
| 6,937,081 B2 * | 8/2005 | Ishikawa | 327/276 |
| 6,941,121 B2 | 9/2005 | Chen | |

FOREIGN PATENT DOCUMENTS

| JP | 02246604 A | * 10/1990 |
|---|---|---|
| JP | 2007-243636 | 9/2007 |

OTHER PUBLICATIONS

A Single-Chip Direct-Sequence Spread-Spectrum CMOS Transceiver for High Performance, Low Cost 2.4-GHz Cordless Applications, Proceedings IEEE Asian Solid-State Circuits Conference Technical Papers, pp. 253-256, Hsinchu, Taiwan, Nov. 2005.
5-GHz CMOS Radio Transceiver Front-End Chipset, IEEE Journal of Solid-State Circuits, pp. 1927-1933, vol. 35, No. 12, Dec. 2000.
A 2-V CMOS Cellular Transceiver Front-End, IEEE Journal of Solid-State Circuits, pp. 1895-1907, vol. 35, No. 12, Dec. 2000.

* cited by examiner

*Primary Examiner*—Dinh T. Le
(74) *Attorney, Agent, or Firm*—Winston Hsu

(57) ABSTRACT

A DC offset calibration apparatus is disclosed. The DC offset calibration apparatus includes an adjustment circuit and an offset calibration circuit. The adjustment circuit is utilized for receiving an input signal and an offset calibration signal, and for adjusting the input signal to generate an output signal according to the offset calibration signal. The offset calibration circuit is coupled to the output signal and to the adjustment circuit for determining the offset calibration signal according to at least the output signal and a predetermined threshold value.

11 Claims, 11 Drawing Sheets

DC OFFSET CALIBRATION APPARATUS AND METHOD

BACKGROUND OF THE INVENTION

1. Field of the Invention

The present invention relates to DC offset calibration technology, and more particularly, to a calibration apparatus and related method, which calibrates DC level of a signal through comparing said signal value and a predetermined threshold value.

2. Description of the Prior Art

Generally speaking, in order to adjust DC offsets resulted from channel effects, manufacturing process variations, power supply voltage variations, temperature variations, or other reasons, so that the varying range of the received signals falls within a dynamic range of later-stage circuitry (such as an analog-to-digital converter), and signal distortion due to saturation can be avoided, a DC offset calibration mechanism is designed into receiving ends of communication systems or other systems having this need.

DC offset calibration apparatuses can be divided into two categories, which are on-line calibration and off-line calibration. The on-line DC offset calibration mechanism usually directly utilizes AC coupling to on-the-fly eliminate the DC offset of input signals or utilizes loop controls to eliminate the DC offset of the input signals by way of feedback. However, this mechanism will result in a slow response speed towards change in DC level of the input signals, mainly due to large time constant of resistor and capacitor components. On the other hand, the off-line DC offset calibration mechanism determines an adjustment amount for eliminating the DC offset in advance when the system is off-line, and utilizes the adjustment amount to eliminate the DC offset of the input signals when the system is on-line. However, just because the adjustment amount is determined off-line, it can hardly timely reflect the real-time change of the DC level of the input signals, so as to dynamically change the adjustment amount. Moreover, in practice the above-mentioned two mechanisms need to detect the DC offset of the input signals across a relatively long time period, in order to obtain a statistical average adjustment amount of the DC offset; hence, the DC offset calibration speed will become even slower. If convergence of a closed loop is further involved, the time required for detecting the DC offset of the input signals will become even lengthened.

SUMMARY OF THE INVENTION

It is therefore one of the objectives of the present invention to provide a DC offset calibration apparatus for timely responding to DC level changes in an input signal according to at least an output signal and a predetermined threshold value, which controls an amplitude of the input signal within a desired predetermined threshold value (such as a predetermined amplitude range) by changing the DC level of the input signal.

According to the claimed invention, a DC offset calibration apparatus is disclosed. The DC offset calibration apparatus includes an adjustment circuit and an offset calibration circuit. The adjustment circuit is used for receiving an input signal and an offset calibration signal and for adjusting the input signal to generate an output signal according to the offset calibration signal. The offset calibration circuit is coupled to the output signal and the adjustment circuit for determining the offset calibration signal according to at least the output signal and a predetermined threshold value.

According to the claimed invention, a DC offset calibration method is further disclosed. The DC offset calibration method includes receiving an input signal and an offset calibration signal and adjusting the input signal to generate an output signal according to the offset calibration signal, and determining the offset calibration signal according to at least the output signal and a predetermined threshold value.

In one embodiment, the predetermined threshold value is a predetermined threshold voltage level.

In one embodiment, the predetermined threshold value is a predetermined threshold voltage difference.

According to the claimed invention, a DC offset calibration apparatus is further disclosed. The DC offset calibration apparatus includes an adjustment circuit and an offset calibration circuit. The adjustment circuit is used for receiving an input signal and an offset calibration signal and for adjusting the input signal to generate an output signal according to the offset calibration signal. The offset calibration circuit is coupled to the adjustment circuit and the output signal. The offset calibration circuit adjusts the offset calibration signal according to the output signal when a predetermined condition is satisfied, and maintains the offset calibration signal when said predetermined condition is not satisfied.

According to the claimed invention, a DC offset calibration method is further disclosed. The DC offset calibration method includes receiving an input signal and an offset calibration signal and adjusting the input signal to generate an output signal according to the offset calibration signal, and adjusting the offset calibration signal according to the output signal when a predetermined condition is satisfied and maintaining the offset calibration signal when said predetermined condition is not satisfied.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
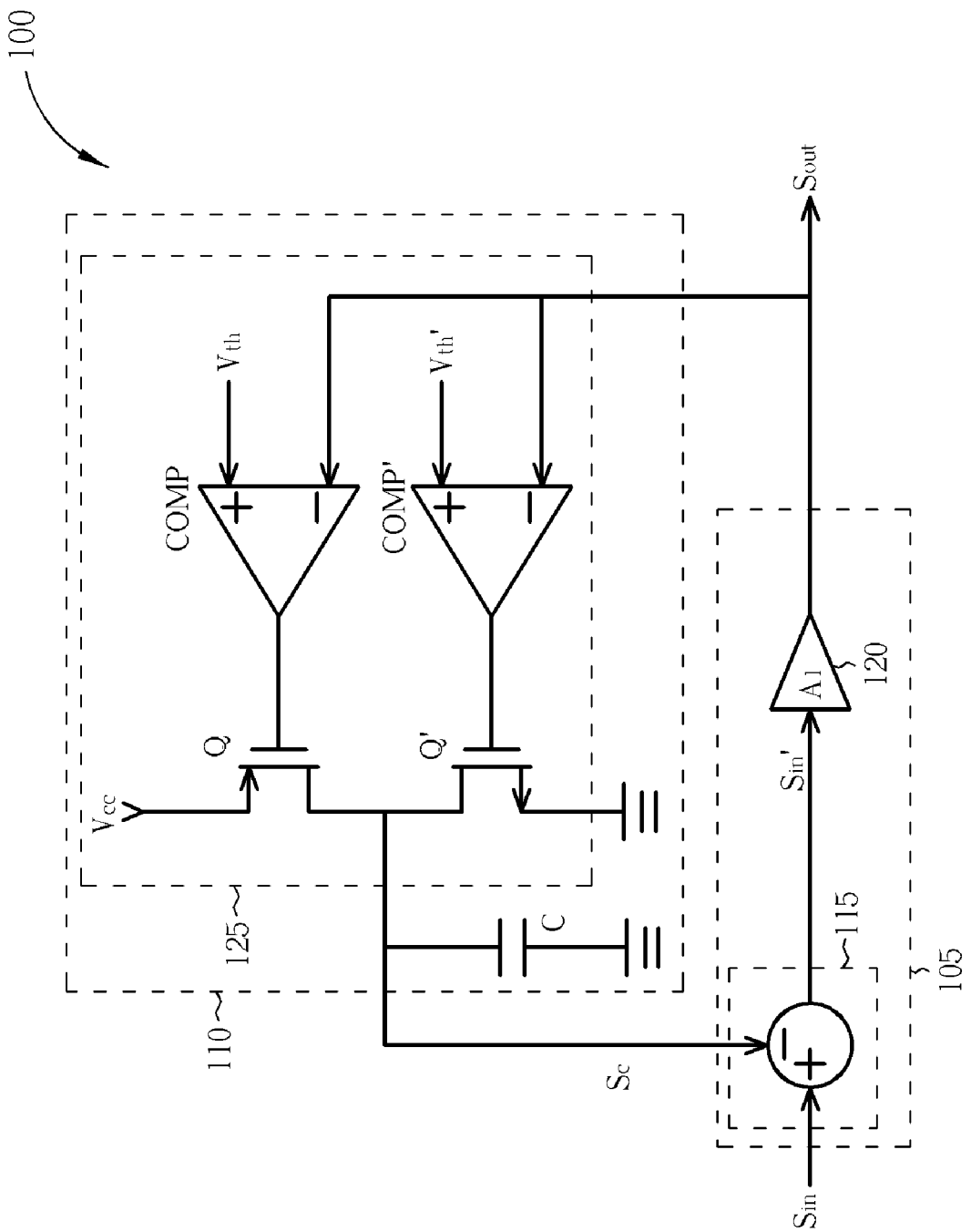
FIG. 1 is a diagram of a DC offset calibration apparatus according to a first embodiment of the present invention.

Please refer to FIG. 1. FIG. 1 is a diagram of a DC offset calibration apparatus 100 according to a first embodiment of the present invention. As shown in FIG. 1, the DC offset calibration apparatus 100 includes an adjustment circuit 105 and a DC calibration circuit 110. The adjustment circuit 105 includes an adjustment unit 115 and an amplifier unit 120 and is used for lowering a voltage level of an input signal $S_{in}$ according to a voltage level of an offset calibration signal $S_c$. The adjustment unit 115 is implemented by a subtractor (as shown in FIG. 1), and the amplifier unit 120 is a single-ended amplifier and utilizes a gain $A_1$ to amplify an output $S_{in}$' of the adjustment unit 115 to generate an output signal $S_{out}$. Therefore, the adjustment circuit 105 adjusts the voltage level of the input signal $S_{in}$ to generate the output signal $S_{out}$ according to the voltage level of the offset calibration signal $S_c$. In addition, the offset calibration circuit 110 determines the offset calibration signal $S_c$ according to the output signal $S_{out}$ and predetermined threshold values (such as predetermined threshold voltage level) $V_{th}$ and $V_{th}$', wherein the value of $V_{th}$ is greater than the value of $V_{th}$'. The offset calibration circuit 110 includes a capacitor C and a calibration circuit 125, wherein the calibration circuit 125 includes comparators COMP, COMP' and transistors Q, Q', and is used for controlling the capacitor C to perform charging or discharging to adjust the voltage level of the offset calibration signal $S_c$, which in turn indirectly adjusts the voltage level of the input signal $S_{in}$. The condition for the capacitor C to perform charging or discharging is that: if the output signal $S_{out}$ satisfies one predetermined condition corresponding to the predetermined threshold voltage levels $V_{th}$ or $V_{th}$', the offset calibration circuit 110 will adjust the offset calibration signal $S_c$; otherwise, if the output signal $S_{out}$ does not satisfy said predetermined condition, the offset calibration circuit 110 will maintain the offset calibration signal $S_c$.

In this embodiment, the predetermined condition is that the output signal $S_{out}$ reaches the predetermined threshold voltage level $V_{th}$ or $V_{th}$' and enters into a voltage range R or R'. For example, if the predetermined condition is that the output signal $S_{out}$ reaches the predetermined threshold voltage level $V_{th}$ and enters into the voltage range R (here the voltage range R is greater than the predetermined threshold voltage level $V_{th}$), the comparator COMP compares the output signal $S_{out}$ with the predetermined threshold voltage level $V_{th}$ to output a control signal, which, at this time, is of low logic level. The control signal will turn on the transistor Q and a power source $V_{cc}$ will charge the capacitor C through the transistor Q; meanwhile, the transistor Q' is turned off due to a control signal outputted by the comparator COMP' being of low logic level. The voltage level of the offset calibration signal $S_c$ is raised due to the capacitor C being charged. Hence, the voltage level of the input signal $S_{in}$ will be indirectly lowered through the adjustment unit 115. In other words, when the voltage level of the output signal $S_{out}$ is greater than the predetermined threshold voltage level $V_{th}$, the offset calibration circuit 110 can timely lower the voltage level of the input signal $S_{in}$ for confining the voltage level of the input signal $S_{in}$ within an amplitude range, so as to avoid an overly elevated DC offsets.

Conversely, if the predetermined condition is that the output signal $S_{out}$ reaches the predetermined threshold voltage level $V_{th}$' and enters into the voltage range R' (here the voltage range R' is lower than the predetermined threshold voltage level $V_{th}$'), the comparator COMP' compares the output signal $S_{out}$ with the predetermined voltage level $V_{th}$' to output a control signal, which, at this time, is of high logic level. The control signal will turn on the transistor Q' and the capacitor C is discharged through the transistor Q' to ground; meanwhile, the transistor Q is turned off due to a control signal outputted by the comparator COMP being of high logic level.

The voltage level of the offset calibration signal $S_c$ is lowered due to the capacitor C being discharged. Hence, the voltage level of the input signal $S_{in}$ will be indirectly raised through the adjustment unit 115. In other words, when the voltage level of the output signal $S_{out}$ is lower than the predetermined threshold voltage level $V_{th}$', the offset calibration circuit 110 can timely raise the voltage level of the input signal $S_{in}$ for confining the voltage level of the input signal $S_{in}$ within an amplitude range, so as to avoid an overly lowered DC offset.

As can be known from the abovementioned, when the output signal $S_{out}$ reaches the predetermined threshold voltage level $V_{th}$ or $V_{th}$' and enters into the voltage range R or R', one of the two transistors Q and Q' is turned on and conducted due to the state of the output signal $S_{out}$, which then further affects the voltage level of the offset calibration signal $S_c$ used for performing the DC offset calibration. That is to say, the DC offset calibration apparatus 100 of this embodiment utilizes a closed loop feedback path to perform the DC offset calibration. Conversely, when the output signal $S_{out}$ lies between the predetermined threshold voltage level $V_{th}$ and the predetermined threshold voltage level $V_{th}$', and does not enter into the voltage range R or R', both of the two transistors Q and Q' are turned off due to the state of the output signal $S_{out}$. Thus, the output signal $S_{out}$ will not affect the voltage level of the offset calibration signal $S_c$ used for performing the DC offset calibration, and the voltage level of the offset calibration signal $S_c$ is maintained as in a previous state due to capacitive effect. In other words, the DC offset calibration apparatus 100 here, by way of open circuit feedback, maintains a previous state in performing the DC offset calibration.

Figure 2:
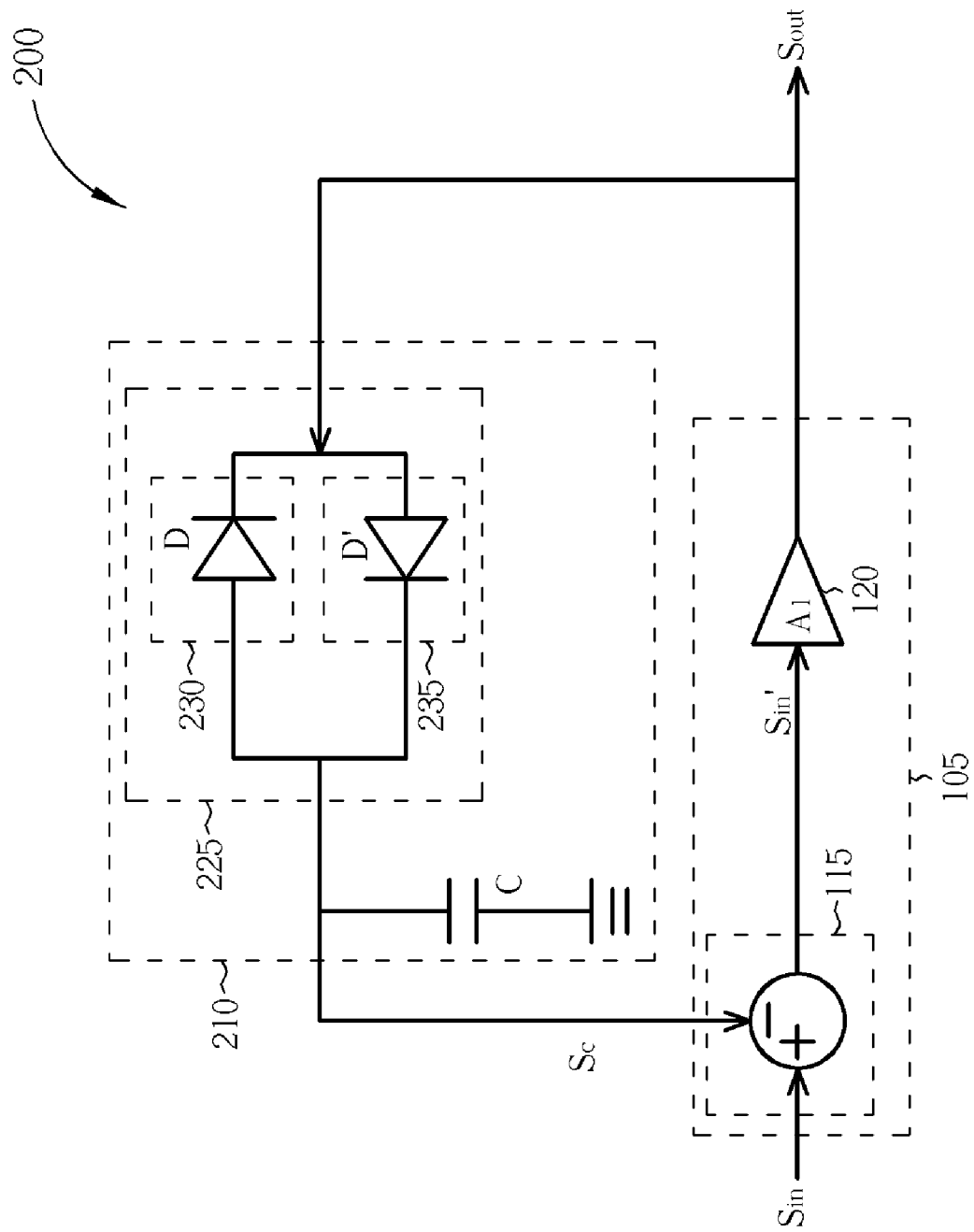
FIG. 2 is a diagram of a DC offset calibration apparatus according to a second embodiment of the present invention.

Please refer to FIG. 2. FIG. 2 is a diagram of a DC offset calibration apparatus 200 according to a second embodiment of the present invention. As shown in FIG. 2, the DC offset calibration apparatus 200 includes an adjustment circuit 105 and an offset calibration circuit 210, wherein the offset calibration circuit 210 includes a capacitor C and a calibration circuit 225 having diode units 230 and 235. For easy illustration, only two diodes D and D' are respectively used for representing the diode units 230 and 235, but the present invention is not limited thereto; in other embodiments, the diode units 230 and 235 can respectively include a plurality of diodes. The offset calibration circuit 210 determines the offset calibration signal $S_c$ according to the output signal $S_{out}$, the offset calibration signal $S_c$, and predetermined threshold values $V_d$ and $V_d$' (in this embodiment, the predetermined threshold voltage level), wherein the predetermined threshold values $V_d$ and $V_d$' are respectively the voltage difference required for turning on the diodes D and D'. The calibration circuit 225 will control the charging or discharging of the capacitor C for adjusting the offset calibration signal $S_c$ through the diodes D and D', which in turn indirectly adjusts the voltage level of the input signal $S_{in}$. The condition for the capacitor C to perform charging or discharging is that: if the output signal $S_{out}$ and the offset calibration signal $S_c$ satisfy a predetermined condition corresponding to the predetermined threshold voltage difference $V_d$' (or $V_d$), the offset calibration circuit 210 will adjust the offset calibration signal $S_c$; otherwise, if the output signal $S_{out}$ and the offset calibration signal $S_c$ do not satisfy said predetermined condition, the offset calibration circuit 210 will maintain the offset calibration signal $S_c$.

In this embodiment, the predetermined condition is that the voltage difference between the output signal $S_{out}$ and the offset calibration signal $S_c$ reaches the predetermined threshold voltage difference $V_d$ or $V_d$'. For example, if the voltage level of the output signal $S_{out}$ is greater than the voltage level of the offset calibration signal $S_c$ (that is, the voltage level of P-type region of the diode D' is greater than the voltage level of N-type region of the diode D') and the voltage difference reaches the predetermined threshold voltage difference $V_d'$, the transistor D' is turned on and conducted due to the forward bias voltage difference being greater than the needed predetermined threshold voltage difference $V_d'$, and the transistor D is turned off due to its remaining in a state of reverse biased. Therefore, the output signal $S_{out}$ will charge the capacitor C through the diode D', and the voltage level of the offset calibration signal $S_c$ is raised due to the charging of the capacitor C, which in turn indirectly lowers the voltage level of the input signal $S_{in}$ to confine the voltage level of the input signal $S_{in}$ within an amplitude range, so as to avoid an overly elevated DC offset. Conversely, if the voltage level of the output signal $S_{out}$ is smaller than the voltage level of the offset calibration signal $S_c$ (that is, the voltage level of the N-type region of the diode D' is smaller than the voltage level of the P-type region of the diode D') and the voltage difference reaches the predetermined threshold voltage difference $V_d$, the transistor D is turned on and conducted due to the forward bias voltage difference being greater than the needed predetermined threshold voltage difference $V_d$, and the transistor D' is turned off due to its remaining in a state of reverse biased. Therefore, the capacitor C will be discharged through the diode D, and the voltage level of the offset calibration signal $S_c$ is lowered due to the discharging of the capacitor C, which in turn indirectly raises the voltage level of the input signal $S_{in}$ to confine the voltage level of the input signal $S_{in}$ within an amplitude range, so as to an overly lowered DC offset.

As abovementioned, when the output signal $S_{out}$ reaches the predetermined threshold voltage differences $V_d$ or $V_d'$, one of these two diodes D and D' is turned on and conducted due to the state of the output signal $S_{out}$, which then further affects the voltage level of the offset calibration signal $S_c$ used for performing the DC offset calibration. That is to say, the DC offset calibration 200 of this embodiment utilizes a closed loop feedback path to perform the DC offset calibration. Conversely, when the output signal $S_{out}$ lies between the predetermined threshold voltage difference $V_d$ and the predetermined threshold voltage difference $V_d'$, both of the two diodes D and D' are turned off due to the state of the output signal $S_{out}$. Thus, the output signal $S_{out}$ will not affect the voltage level of the offset calibration signal $S_c$ used for performing the DC offset calibration, and the voltage level of the offset calibration signal $S_c$ is maintained as in previous state due to capacitive effect. In other words, the DC offset calibration apparatus 200 here, by way of open circuit feedback, maintains a previous state for performing the DC offset calibration.

Figure 3:
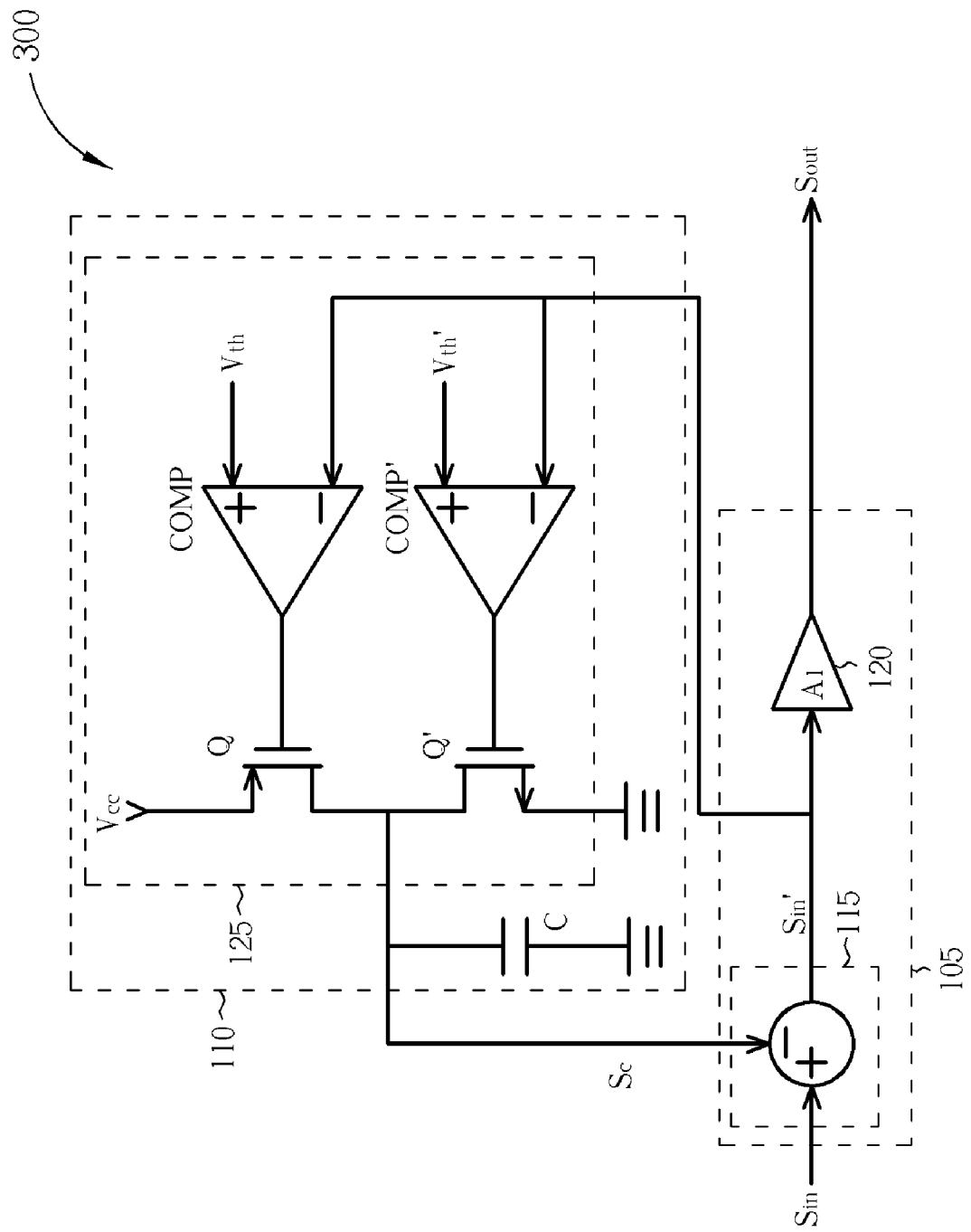
FIG. 3 is a diagram of a DC offset calibration apparatus according to a third embodiment of the present invention.
Figure 4:
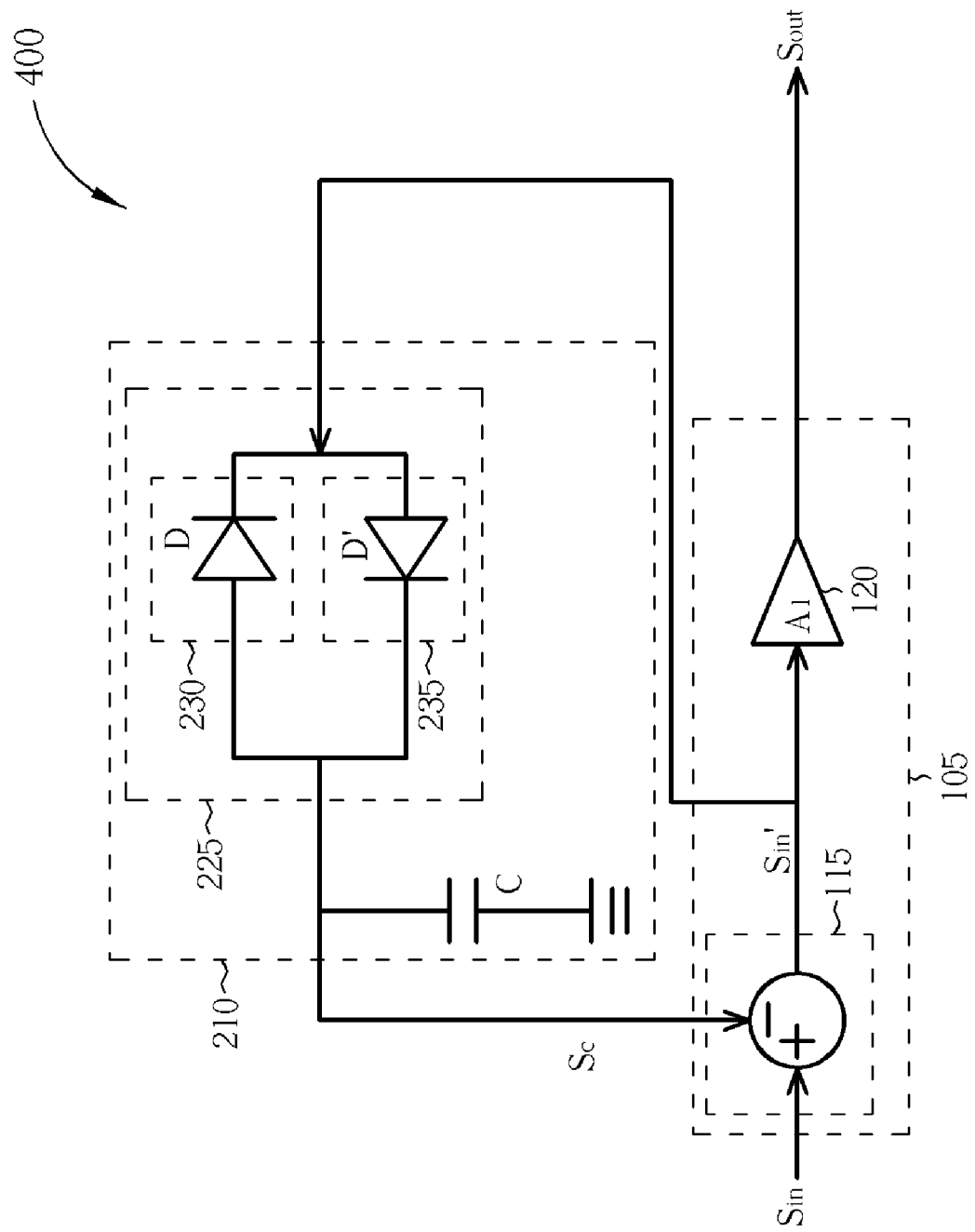
FIG. 4 is a diagram of a DC offset calibration apparatus according to a fourth embodiment of the present invention.
Figure 5:
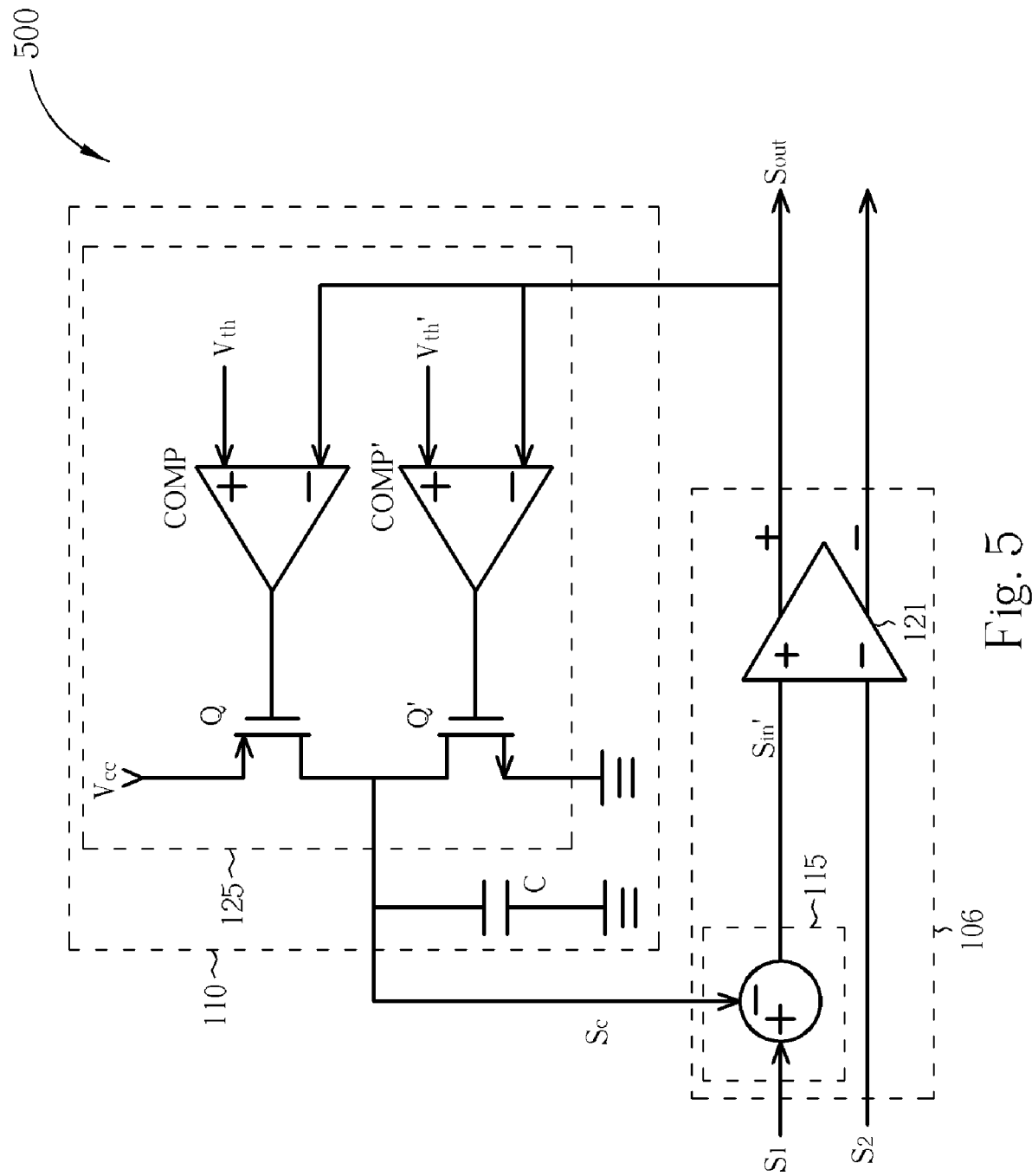
FIG. 5 is a diagram of a DC offset calibration apparatus according to a fifth embodiment of the present invention.
Figure 6:
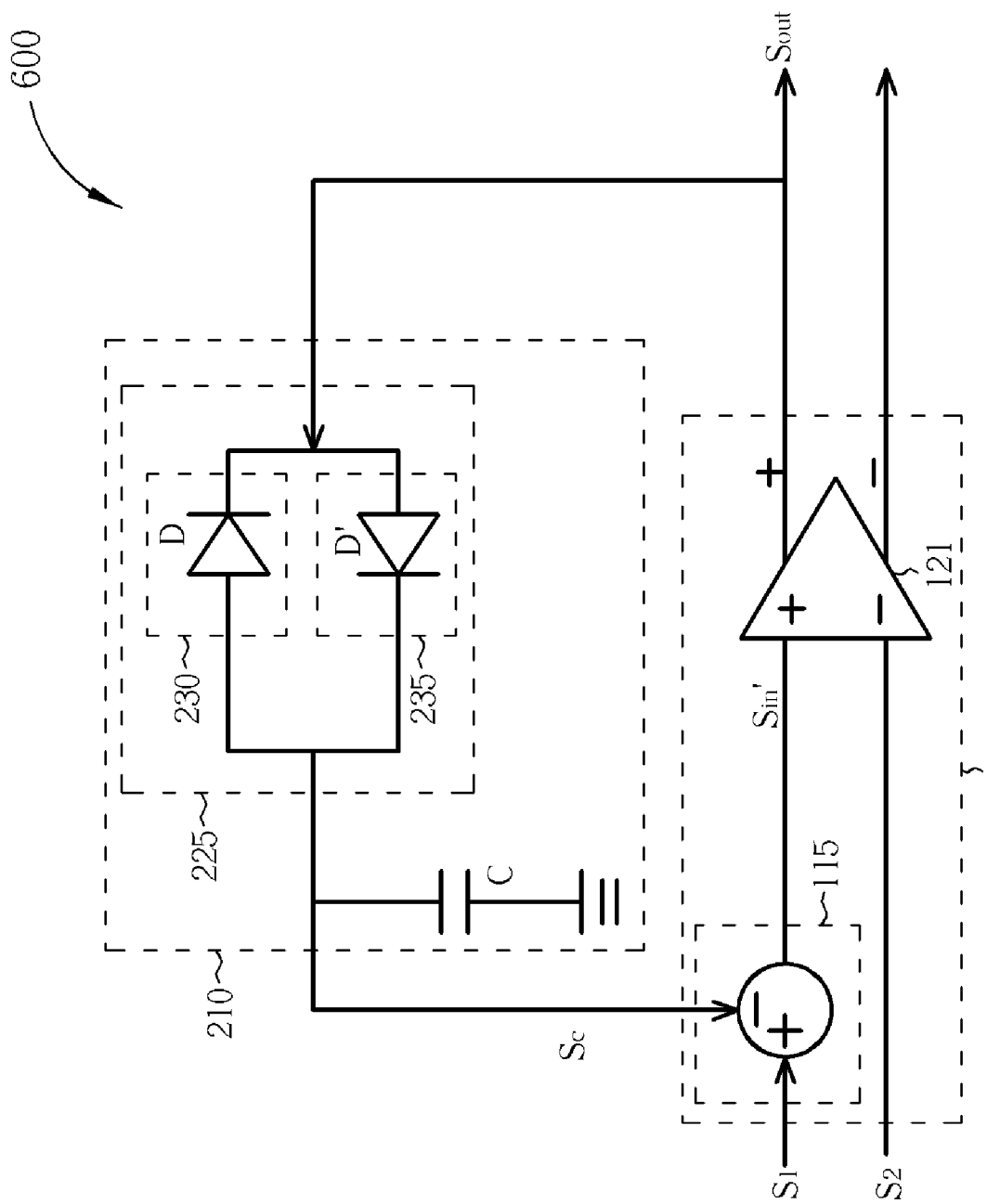
FIG. 6 is a diagram of a DC offset calibration apparatus according to a sixth embodiment of the present invention.
Figure 7:
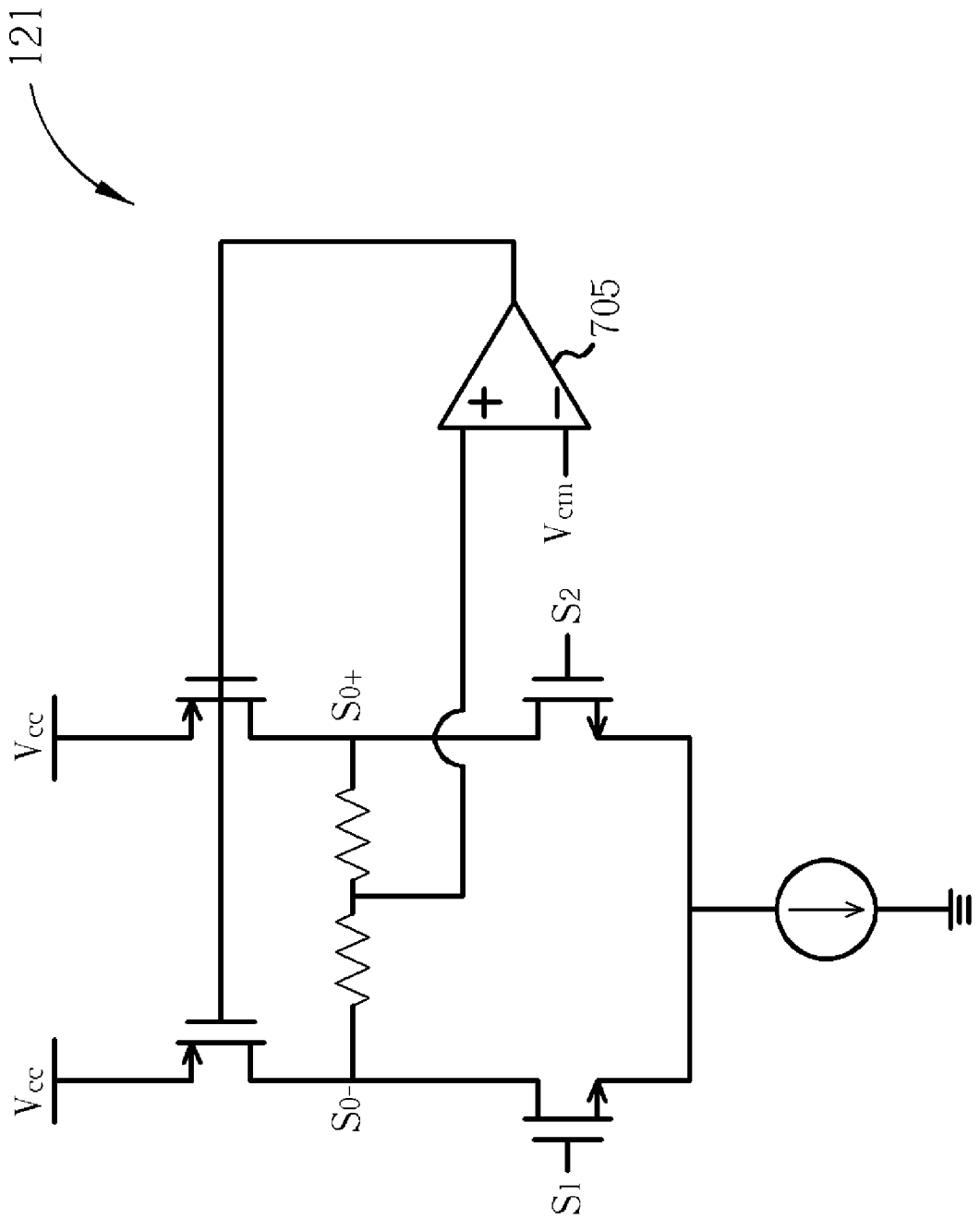
FIG. 7 is a diagram of the differential amplifier circuit shown in FIG. 5 and FIG. 6.

Furthermore, in other embodiments, the signal before amplified by the amplifier unit 120 can also be referenced, instead of referral to the output of the amplifier unit 120, to calibrate the DC offset of the input signal $S_{in}$. That is, the output $S_{in}'$ of the adjustment unit 115 can be directly fed into the comparators COMP and COMP' or to the diodes D and D', and appropriate predetermined threshold voltage levels $V_{th}$ and $V_{th}'$ or appropriate predetermined threshold voltage differences $V_d$ or $V_d'$ can be set to reach the goal of calibrating the DC offsets of the input signal $S_{in}$ To this effect, please refer to FIG. 3 and FIG. 4, which are respective diagrams of DC offset calibration apparatus 300 and 400 according to a third embodiment and a fourth embodiment of the present invention. In addition, please refer to FIG. 5 and FIG. 6, which are respective diagrams of DC offset calibration apparatus 500 and 600 according to a fifth embodiment and a sixth embodiment of the present invention. The offset calibration circuits 110 and 210 can be applied to calibrate the DC offsets of differential input signals $S_1$ and $S_2$ or the DC offsets caused from manufacturing process mismatch in the transistors. Please further refer to FIG. 7, which is a diagram of the differential amplifier circuit 121 shown in FIG. 5 and FIG. 6. The differential amplifier circuit 121 in FIG. 7 is a typical differential amplifier circuit, which is composed of a plurality of active elements, such as transistors, to respectively constitute its gain stage and its loading. The implementation and operating principle of such a differential amplifier are well known by those skilled in the art and are therefore not described herein in further detail. Please note that, the differential amplifier circuit 121 further includes a common-mode feedback path coupled between the output end and the input end, for constraining a common-mode voltage (that is, the DC voltage level) of the positive and the negative signals of the output ends to a reference common-mode voltage $V_{cm}$. In this embodiment, the common-mode feedback path is composed of two resistors and one comparator 705 that are coupled to the output ends, wherein the comparator 705 controls two active loadings according to a midpoint voltage of the two resistors and the reference common-mode voltage $V_{cm}$. Through the common-mode feedback mechanism described above, the DC level of the two output signals $S_1'$ and $S_2'$ converge and tend to become identical. In addition, due to the differential signal to be processed having a characteristic of symmetrical peak amplitude or constant envelope, when one of the output signals $S_1'$ and $S_2'$ is DC offset calibrated by the offset calibration circuits 110 or 210, calibration of the other output signal to the same degree will be warranted.

In addition, in the abovementioned embodiments, if only the situation of overly elevated DC offset is of concern, the comparator COMP' and the transistor Q' can be removed from the calibration circuit 125 or the diode D can be removed from the calibration circuit 225. As such, the calibration circuit 125 only performs calibration of the overly elevated DC offset by controlling the turning on the transistor Q to charge the capacitor C when the output signal $S_{out}$ is greater than the predetermined threshold voltage level $V_{th}$, and the calibration circuit 225 only performs calibration of the overly elevated DC offset by charging the capacitor C when the diode D' is turned on. On the other hand, if only the overly lowered DC offset is of concern, the comparator COMP and the transistor Q can be removed from the calibration circuit 125 or the diode D' can be removed from the calibration circuit 225. As such, the calibration circuit 125 only performs the calibration of overly lowered DC offset by controlling the turning on the transistor Q' to discharge the capacitor C when the output signal $S_{out}$ is lower than the predetermined threshold voltage level $V_{th}'$, and the calibration circuit 225 only performs the calibration of overly lowered DC offset by discharging the capacitor C when the diode D is turned on.

For a differential signal pair, if it is provided with a characteristic of symmetrical peak amplitude or constant envelope (such as the preamble data of the OFDM signal in WLAN systems), the goal of simultaneously calibrating the DC offset of both the positive and negative ends of the differential signal can be achieved simply by designing a DC offset calibration mechanism, which can control the DC level at the positive and negative ends of the differential input signal pair and converge the two to the same level. For a differential signal pair having the abovementioned characteristic of symmetrical peak amplitude or constant envelope, the peak amplitude of the positive signal (that is, a voltage difference between the peak value and the DC voltage level) is symmetrical to the peak amplitude of the negative signal (i.e., having the same magnitude but opposite in phase, or sign). Thus, as long as the DC voltage level of the positive signal after calibration and that of the negative signal after calibration are adjusted to an identical value when performing the DC offset calibration, it can be insured that when the DC offset calibration of one of the two signals (positive and negative) satisfies the input range requirement of later stage circuitry, the DC offset calibration of the other will satisfy, too.

Figure 8:
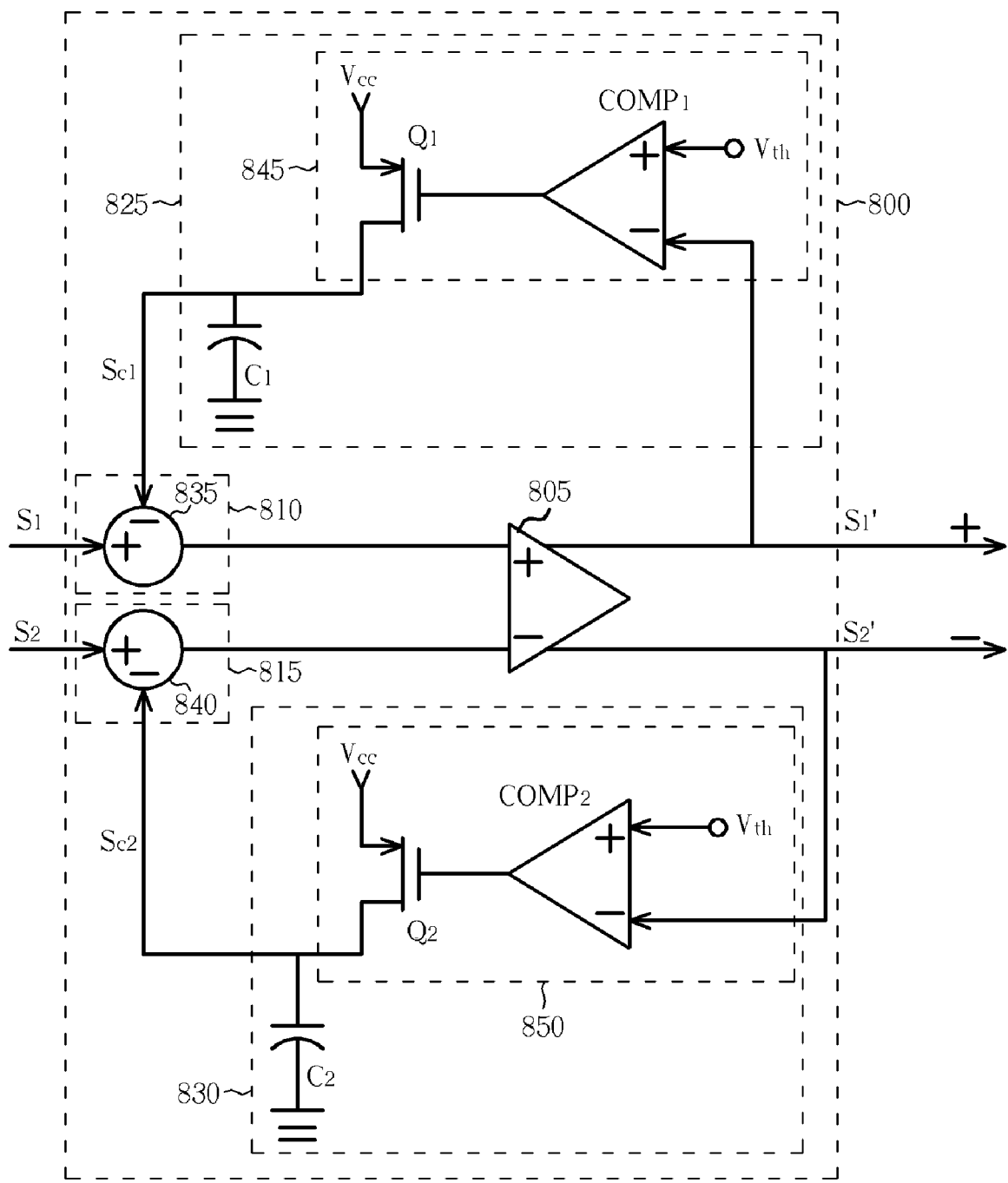
FIG. 8 is a diagram of a DC offset calibration apparatus according to a seventh embodiment of the present invention.

Please refer to FIG. 8. FIG. 8 is a diagram of a DC offset calibration apparatus 800 according to a seventh embodiment of the present invention. As shown in FIG. 8, the DC offset calibration apparatus 800 respectively calibrates input signals $S_1$ and $S_2$ (assuming that the input signals $S_1$ and $S_2$ have the characteristic of symmetrical peak amplitude or constant envelope) and the DC offset caused from manufacturing process mismatch of a differential amplifier unit 805 in the DC offset calibration apparatus 800, to generate output signals $S_1'$ and $S_2'$. The DC offset calibration apparatus 800 further includes adjustment units 810 and 815 (respectively implemented by subtractors 835 and 840) and offset calibration circuits 825 and 830. The voltage level of the input signal $S_1$ is adjusted by the adjustment unit 810 according to the voltage level of the offset calibration signal $S_{c1}$, and the output signal after adjustment is amplified to generate the output signal $S_1'$. The voltage level of the input signal $S_2$ is adjusted by the adjustment unit 815 according to the voltage level of the offset calibration signal $S_{c2}$, and the output signal after adjustment is amplified to generate the output signal $S_2'$.

Besides, the offset calibration circuit 825 further includes a capacitor $C_1$ and a calibration circuit 845 having a transistor $Q_1$ and a comparator $COMP_1$, wherein the offset calibration circuit 825 is used for determining the voltage level of the offset calibration signal $Sc_1$ according to the voltage level of the output signal $S_1'$ and a predetermined threshold voltage level $V_{th}$. If the output signal $S_1'$ satisfies a first predetermined condition corresponding to the predetermined threshold value voltage level $V_{th}$, the offset calibration circuit 825 will use the comparator $COMP_1$ to control the turning on of the transistor $Q_1$ to charge the capacitor $C_1$ for adjusting the offset calibration signal $S_{c1}$. At this time, a closed loop DC offset calibration mechanism is formed in the DC offset calibration apparatus 800 due to the transistor $Q_1$ being turned on. If the output signal $S_1'$ does not satisfy the first predetermined condition, the offset calibration circuit 825 will use the comparator $COMP_1$ to control the turning off of the transistor $Q_1$, and the offset calibration circuit 825 will maintain the offset calibration signal $S_{c1}$. At this time, an open loop DC offset calibration mechanism is formed in the DC offset calibration apparatus 800. In addition, the offset calibration circuit 830 further includes a capacitor $C_2$ and a calibration circuit 850 having a transistor $Q_2$ and a comparator $COMP_2$, wherein the offset calibration circuit 830 is used for determining the voltage level of the offset calibration signal $S_{c2}$ according to the voltage level of the output signal $S_2'$ and the predetermined threshold value $V_{th}$. If the output signal $S_2'$ satisfies a second predetermined condition corresponding to the predetermined threshold value $V_{th}$, the offset calibration circuit 830 will use the comparator $COMP_2$ to control the turning on of the transistor $Q_2$ to charge the capacitor $C_2$ for adjusting the offset calibration signal $S_{c2}$. On the other hand, the offset calibration circuit 830 will maintain the offset calibration signal $S_{c2}$ if the output signal $S_2'$ does not satisfy the second predetermined condition.

As abovementioned, the predetermined threshold value $V_{th}$ is a predetermined threshold voltage level, the first predetermined condition is that the voltage level of the output signal $S_1'$ exceeds the predetermined threshold voltage level $V_{th}$, and the second predetermined condition is that the voltage level of the output signal $S_2'$ exceeds the predetermined threshold voltage level $V_{th}$. Hence, if the first predetermined condition is satisfied, the comparator $COMP_1$ will output a control signal of low logic level for turning on the transistor $Q_1$. A power source $V_{cc}$ will charge the capacitor $C_1$ through the transistor $Q_1$, thus the voltage level of the offset calibration signal $S_{c1}$ will be raised by the charging of the capacitor $C_1$. The voltage level of the input signal $S_1$ will be lowered to generate the output signal $S_1'$ through the subtractor 835. For this reason, a maximum value of the voltage level of the output signal $S_1'$ is confined by the predetermined threshold voltage value $V_{th}$. Similarly, if the second condition is satisfied, the operation of the offset calibration circuit 830 is the same as the operation of the offset calibration circuit 825. The comparator $COMP_2$ will output a control signal of low logic level for turning on the transistor $Q_2$. The power source $V_{cc}$ will charge the capacitor $C_2$ through the transistor $Q_2$, thus the voltage level of the offset calibration signal $S_{c2}$ will be raised by the charging of the capacitor $C_2$. The voltage level of the input signal $S_2$ will be lowered to generate the output signal $S_2'$ through the subtractor 840. For this reason, a maximum value of the voltage level of the output signal $S_2'$ is confined by the predetermined threshold voltage value $V_{th}$. As abovementioned, the offset calibration circuits 825 and 830 respectively confine the maximum values of the voltage level of the output signals $S_1'$ and $S_2'$ to the same predetermined threshold voltage value $V_{th}$. Due to the input signals $S_1$ and $S_2$ having a characteristic of symmetrical peak amplitude or constant envelope, the goal of simultaneously accomplishing the DC offset calibration of the positive and negative signals $S_1$ and $S_2$ can be achieved simply by adopting specific control mechanism, such that the DC offsets of both the input signal $S_1$ and $S_2$ tend to converge to the same value. Therefore, for later stage circuitry (such as an analog-to-digital converter, not shown in FIG. 8), if the value of the predetermined threshold voltage value $V_{th}$ is designed to be smaller than the dynamic range of its input ends, a signal saturation phenomenon will not be observed in the DC offset of the input ends. Of course, the DC offset calibration apparatus 800 can also co-operate with the differential amplifier circuit 121 having the common-mode feedback path as in FIG. 7, to ensure that both the positive signal and the negative signal are calibrated appropriately. Hence, for later stage circuitry (not shown in FIG. 8) a signal saturation phenomenon due to DC offset will not be observed even when the signals are amplified.

Figure 9:
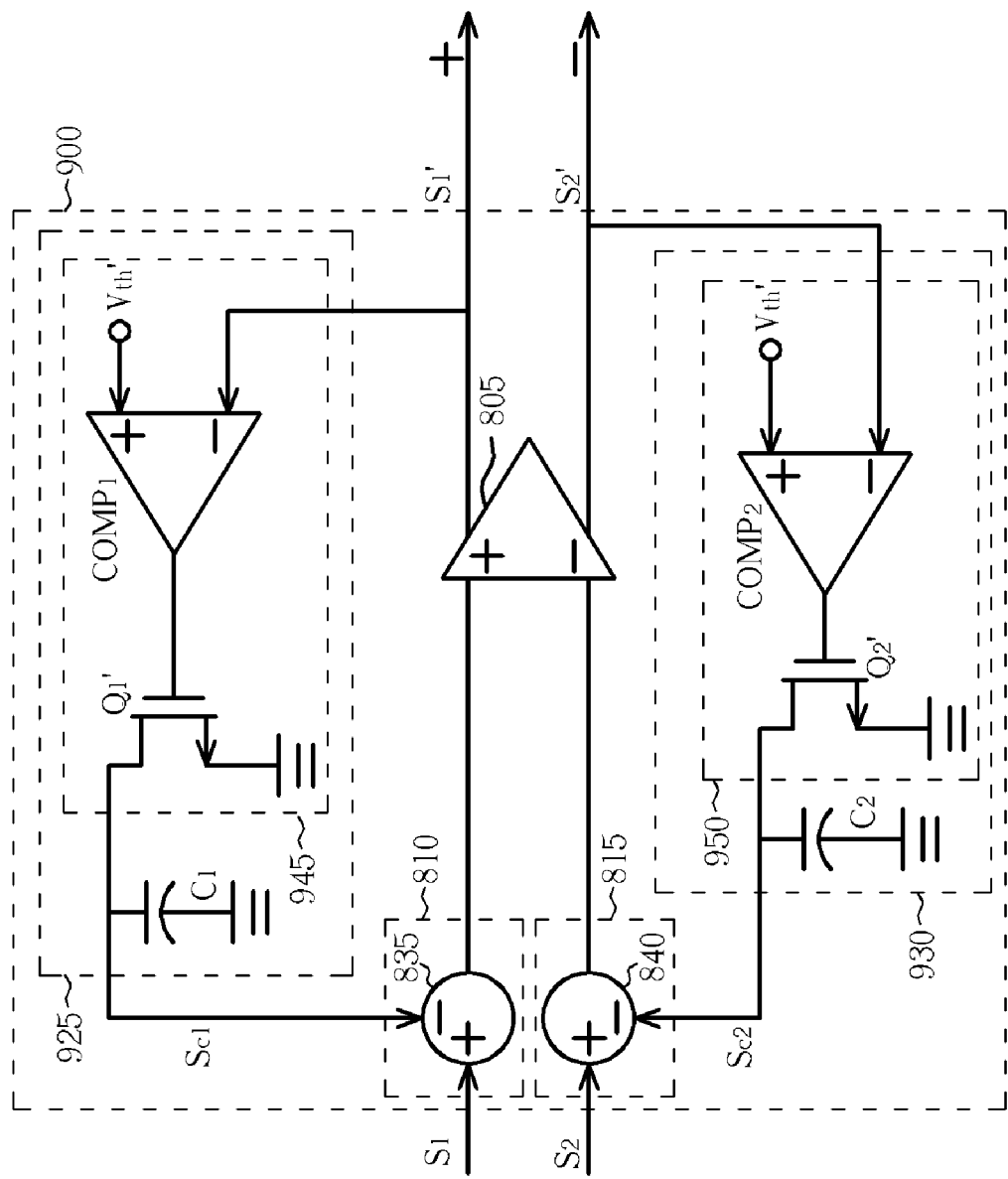
FIG. 9 is a diagram of a DC offset calibration apparatus according to an eighth embodiment of the present invention.

Furthermore, by restricting the minimum amplitude of two differential output signals (that is, the peak value in another direction) to the same predetermined threshold voltage level, the objective of calibrating to the same DC offset level can also be achieved. Please refer to FIG. 9. FIG. 9 is a diagram of a DC offset calibration apparatus 900 according to an eighth embodiment of the present invention. The major difference between the DC offset calibration apparatuses 800 and 900 is that, instead of utilizing the power source $V_{cc}$ to perform charging to calibrate the differential output signals $S_1'$ and $S_2'$ to the same DC offset levels, the DC offset calibration apparatus 900, according to a predetermined threshold voltage level $V_{th}'$, utilizes respectively the comparators $COMP_1$ and $COMP_2$ and the capacitors $C_1$ and $C_2$ of the offset calibration circuits 925 and 930, to perform discharging through transistors $Q_1'$ and $Q_2'$ to ground. If a first predetermined condition is satisfied; that is, the voltage level of the output signal $S_1'$ is smaller than the predetermined threshold voltage level $V_{th}'$, the comparator $COMP_1$ will output a control signal of high logic level to turn on the transistor $Q_1'$. The capacitor $C_1$ will be discharged to ground through the transistor $Q_1'$, thus the voltage level of the offset calibration signal $S_{c1}$ will be lowered by the discharging of the capacitor $C_1$. The voltage level of the input signal $S_1$ will be raised to generate the output signal $S_1'$. For this reason, a lowest voltage level of the output signal $S_1'$ will be restricted to the predetermined threshold voltage value $V_{th}'$. Similarly, if a second condition is satisfied; that is, the voltage level of the output signal $S_2'$ is smaller than the predetermined threshold voltage level $V_{th}'$. The capacitor $C_2$ will be discharged to ground through the transistor $Q_2'$, thus the voltage level of the offset calibration signal $S_{c2}$ will be lowered by the discharging of the capacitor $C_2$. The voltage level of the input signal $S_2$ will be raised to generate the output signal $S_2'$. For this reason, a lowest voltage level of the output signal $S_2'$ will be restricted to the predetermined threshold voltage value $V_{th}'$. As abovementioned, the lowest voltage levels of the output signals $S_1'$ and $S_2'$ are restricted to the same predetermined threshold voltage value $V_{th}'$. Similarly, the DC offset calibration apparatus 900 of this embodiment will co-operate with the differential amplifier circuit 121 having the common-mode feedback path in FIG. 7 to ensure that both the positive signal and the negative signal are calibrated appropriately. Hence, at later stage circuitry (not shown in FIG. 9) a signal saturation phenomenon due to DC offset will not be observed even when the signals are amplified.

Figure 10:
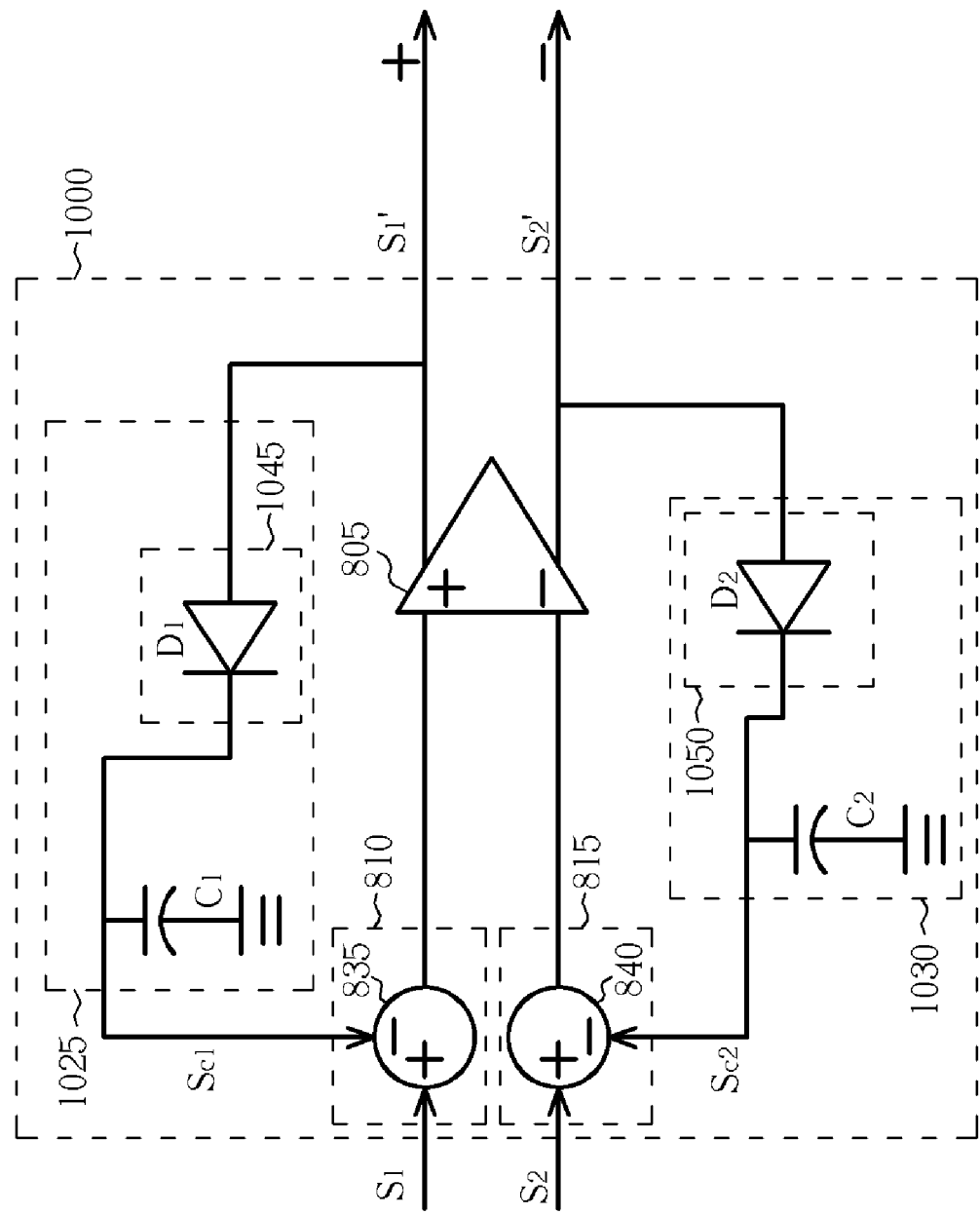
FIG. 10 is a diagram of a DC offset calibration apparatus according to a ninth embodiment of the present invention.

Please refer to FIG. 10. FIG. 10 is a diagram of a DC offset calibration apparatus 1000 according to a ninth embodiment of the present invention. The DC offset calibration apparatus 1000 utilizes respectively the voltage levels of the output signals $S_1'$ and $S_2'$, the offset calibration signals $S_{c1}$ and $S_{c2}$, and a predetermined threshold value $V_D$, to which the diode units (for easy illustration, two diodes $D_1$ and $D_2$ are used for representing the diode units in FIG. 10) of the calibration circuits 1045 and 1050 correspond, for determining the voltage levels of the offset calibration signals $S_{c1}$ and $S_{c2}$, wherein the predetermined threshold value $V_D$ is a predetermined threshold voltage difference in this embodiment. When the output signal $S_1'$ satisfies a first predetermined condition of the predetermined threshold voltage difference $V_D$ (in this embodiment, the first predetermined condition is that a voltage difference between the output signal $S_1'$ and the offset calibration signal $S_{c1}$ reaches the predetermined threshold voltage difference $V_D$), the offset calibration circuit 1025 adjusts the offset calibration signal $S_{c1}$; otherwise, the offset calibration circuit 1025 maintains the offset calibration signal $S_{c1}$. Similarly, when the output signal $S_2'$ satisfies a second predetermined condition of the predetermined threshold voltage difference $V_D$ (in this embodiment, the second predetermined condition is that a voltage difference between the output signal $S_2'$ and the offset calibration signal $S_{c2}$ reaches the predetermined threshold voltage difference $V_D$), the offset calibration circuit 1030 adjusts the offset calibration signal $S_{c2}$; otherwise, the offset calibration circuit 1030 maintains the offset calibration signal $S_{c2}$.

The predetermined voltage difference $V_D$ represents a minimum bias voltage for the diodes $D_1$ and $D_2$ to be forward conducted, which is actually the turn-on voltage (here assuming that their bias voltages are identical). In other words, when the voltage level of the output signal $S_1'$ is greater than the voltage level of the offset calibration signal $S_{c1}$ and reaches the predetermined threshold voltage difference $V_D$, the diode $D_1$ will become conducted and the output signal $S_1'$ will start charging the capacitor $C_1$ through the diode $D_1$ and raise the voltage level of the offset calibration signal $S_{c1}$. Similarly, when the voltage level of the output signal $S_2'$ is greater than the voltage level of the offset calibration signal $S_{c2}$ and reaches the predetermined threshold voltage difference $V_D$, the diode $D_2$ will become conducted and the output signal $S_2'$ will start charging the capacitor $C_2$ through the conducted diode $D_2$ and raise the voltage level of the offset calibration signal $S_{c2}$. Likewise, the DC offset calibration apparatus 1000 of this embodiment will co-operate with the differential amplifier circuit 121 having the common-mode feedback path in FIG. 7 to ensure that both the positive signal and the negative signal are calibrated appropriately. Hence, an erroneous operation will not be observed at later stage circuitry.

Figure 11:
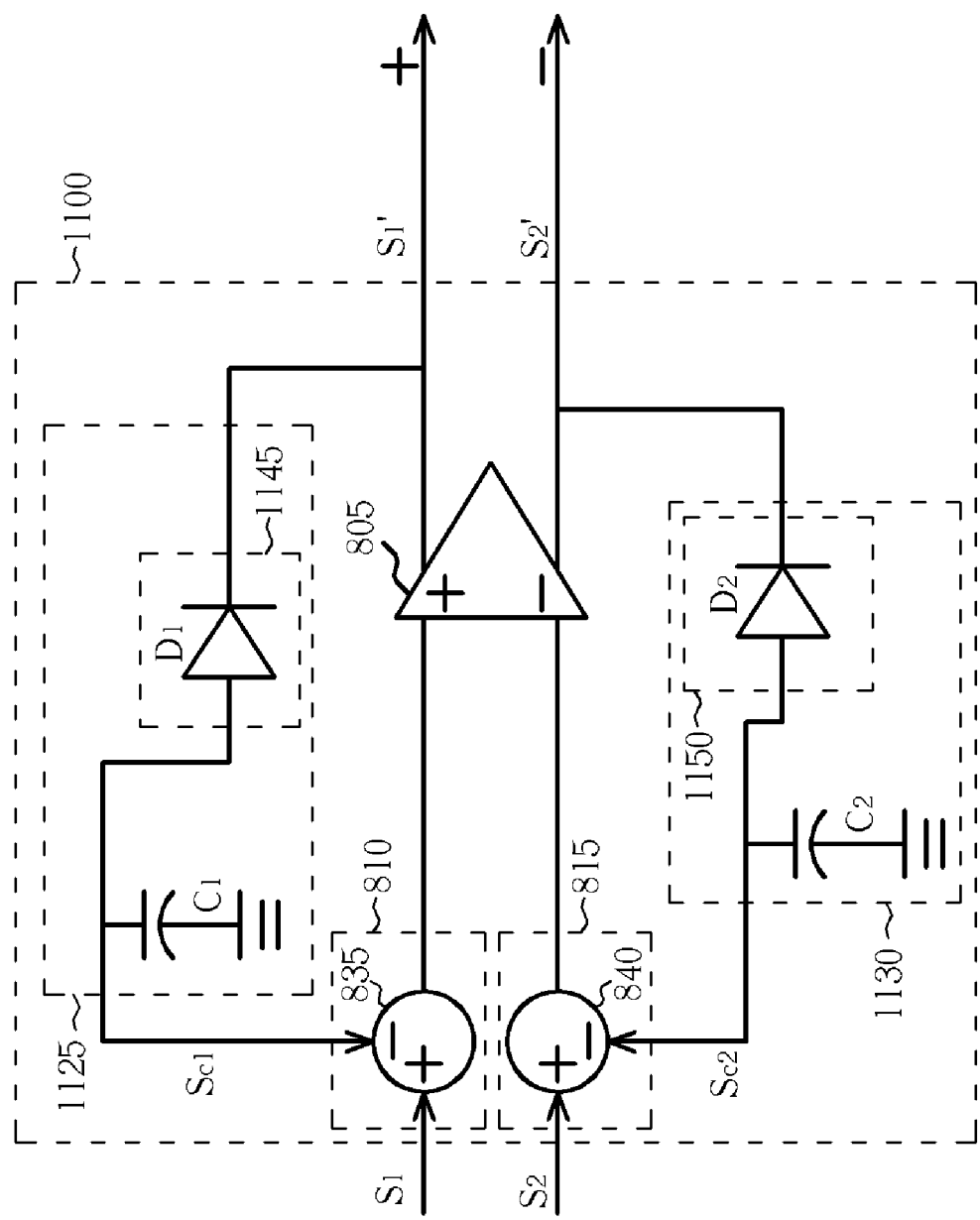
FIG. 11 is a diagram of a DC offset calibration apparatus according to a tenth embodiment of the present invention.

Please refer to FIG. 11. FIG. 1 is a diagram of a DC offset calibration apparatus 1100 according to a tenth embodiment of the present invention. In this embodiment, the connection configuration of the diodes $D_1$ and $D_2$ in FIG. 10 is replaced by the connection configuration of the diodes $D_1$ and $D_2$ in FIG. 11; that is, the P-type regions of the diodes $D_1$ and $D_2$ are now coupled to the offset calibration signals $S_{c1}$ and $S_{c2}$, respectively, and the N-type regions of the diodes $D_1$ and $D_2$ are now coupled to the output signals $S_1'$ and $S_2'$, respectively. Hence, when the voltage level of the output signal $S_1'$ is lower than the voltage level of the offset calibration signal $S_{c1}$ and reaches the predetermined threshold voltage difference $V_D$, the diode $D_1$ will become conducted and the capacitor $C_1$ will be discharged through the diode $D_1$, to lower the voltage level of the offset calibration signal $S_{c1}$. When the voltage level of the output signal $S_2'$ is lower than the voltage level of the offset calibration signal $S_{c2}$ and reaches the predetermined threshold voltage difference $V_D$, the diode $D_2$ will become conducted and the capacitor $C_2$ will be discharged through the conducted diode $D_2$, to lower the voltage level of the offset calibration signal $S_{c2}$. Likewise, the DC offset calibration apparatus 1100 of this embodiment will co-operate with the differential amplifier circuit 121 having the common-mode feedback path in FIG. 7 to ensure that both the positive signal and the negative signal are calibrated appropriately. Hence, the output signals $S_1'$ and $S_2'$ can be restricted to the same DC offset level, so that erroneous operation will not be observed at later stage circuitry.

Moreover, if the advantage of the voltage gain provided by the differential amplifier circuit 805 is not necessarily desired, the outputs of the adjustment units 810 and 815 can also be directly fed into the comparators COMP and COMP' or the diodes D and D', and then appropriate predetermined threshold voltage levels $V_{th}$ and $V_{th}'$ or appropriate predetermined threshold voltage differences $V_d$ or $V_d'$ can be set to reach the goal of calibrating the DC offsets of the input signals $S_1$ and $S_2$. Such a modification should also fall within the scope of the present invention. Obviously, the abovementioned DC offset calibration mechanism that directly feeds the outputs of the adjustment units 810 and 815 into the comparators COMP and COMP' or the diodes D and D' to calibrate the DC offsets of the input signals $S_1$ and $S_2$ can still co-operate with the differential amplifier circuit 121 having the common-mode feedback path in FIG. 7, to ensure that both the positive signal and the negative signal are calibrated appropriately. But the differential amplifier circuit 121 here is preferably located in later stage circuitry of the DC offset calibration mechanism.

In summary, the abovementioned DC offset calibration device performs the DC offset calibration through the closed loop control only when the voltage levels of the output signals (which can be the signal voltage level before or after the processing of a single-ended amplifier, or the signal voltage level before or after the processing of a differential amplifier) satisfy certain predetermined condition as above-mentioned. However, even when the predetermined condition is not satisfied, the voltage levels of the offset calibration signals during the closed loop control will be maintained by the capacitors $C_1$ and $C_2$ having the characteristic of charge buffering. Hence, although at this time the DC offset calibrations is not performed through the closed loop control, the DC offset calibrations can still be performed through open loop control. The DC offset calibration apparatus disclosed in the present invention can simultaneously be provided with the advantages of fast speed (shorter convergence time) during the open loop control and undistorted signals during the closed loop control. The present invention can be preferably applied to calibrate the DC offset of input signals of analog-to-digital converters. At this time, the predetermined threshold value can be designed to be a smaller value than the input dynamic range of the analog-to-digital converter, to make sure that the input signal will fall within the input dynamic range.

Those skilled in the art will readily observe that numerous modifications and alterations of the device and method may be made while retaining the teachings of the invention.

What is claimed is:

1. A DC offset calibration apparatus comprising:
   an adjustment circuit used for receiving an input signal and an offset calibration signal and for raising or lowering a voltage level of the input signal to generate an output signal according to a voltage level of the offset calibration signal; and
   an offset calibration circuit, coupled to the output signal and the adjustment circuit, for determining the voltage level of the offset calibration signal, the offset calibration circuit comprising:
      a comparator used for comparing the output signal with a predetermined threshold voltage level and thereby generating a control signal; and
      a transistor, having a first end coupled to a reference voltage level, a second end coupled to the voltage level of the offset calibration signal and the adjustment circuit, and a control end coupled to the comparator,
      wherein the control signal turns on the transistor when the output signal reaches the predetermined threshold voltage level and enters a predetermined voltage range, so as to raise or lower the voltage level of the offset calibration signal by the reference voltage level and consequently adjust the voltage level of the input signal through the adjustment circuit, and the control signal turns off the transistor and keeps the voltage level of the input signal unchanged when the output signal neither reaches the predetermined threshold voltage level nor enters the predetermined voltage range.

2. The DC offset calibration apparatus of claim 1, wherein a voltage level within the predetermined voltage range is greater than the predetermined threshold voltage level.

3. The DC offset calibration apparatus of claim 1, wherein a voltage level within the predetermined voltage range is lower than the predetermined threshold voltage level.

4. The DC offset calibration apparatus of claim 1, wherein the offset calibration circuit further comprises:
   a voltage level holding circuit, coupled to the second end of the transistor and the adjustment circuit, for holding the voltage level of the offset calibration signal.

5. The DC offset calibration apparatus of claim 4, wherein the voltage level holding circuit comprises a capacitor being charged or discharged by the reference voltage level and thereby raising or lowering the voltage level of the offset calibration signal.

6. A DC offset calibration apparatus comprising:
   an adjustment circuit for receiving an input signal and an offset calibration signal and for raising or lowering a voltage level of the input signal to generate an output signal according to a voltage level of the offset calibration signal; and
   an offset calibration circuit, coupled to the output signal and the adjustment circuit, for determining the voltage level of the offset calibration signal, the offset calibration circuit comprising:
      a voltage threshold circuit having a turn-on voltage and comprising a first end coupled to the output signal and a second end coupled to the voltage level of the offset calibration signal and the adjustment circuit,
      wherein when a difference between the output signal and the voltage level of the offset calibration signal reaches the turn-on voltage, the voltage threshold circuit is conducted to raise or lower the voltage level of the offset calibration signal by the output signal and consequently adjust the voltage level of the input signal through the adjustment circuit, and when the difference does not reach the turn-on voltage, the voltage threshold circuit is not conducted and the voltage level of the input signal is thereby kept unchanged.

7. The DC offset calibration apparatus of claim 1, wherein the adjustment circuit comprises:
   a subtractor used for raising or lowering the voltage level of the input signal according to the voltage level of the offset calibration signal; and
   an amplifying unit, coupled to the subtractor, for amplifying an output of the subtractor to generate the output signal.

8. The DC offset calibration apparatus of claim 6, wherein the adjustment circuit comprises:
   a substractor for raising or lowering the voltage level of the input signal according to the voltage level of the offset calibration signal; and
   an amplifying unit, coupled to the substractor, for amplifying an output of the substractor to generate the output signal.

9. The DC offset calibration apparatus of claim 6, wherein the voltage threshold circuit is a diode circuit comprising at least one diode.

10. The DC offset calibration apparatus of claim 6, wherein the offset calibration circuit further comprises:
    a voltage level holding circuit, coupled to the voltage threshold circuit and the adjustment circuit, for holding the voltage level of the offset calibration signal.

11. The DC offset calibration apparatus of claim 10, wherein the voltage level holding circuit comprises a capacitor being charged or discharged by the output signal and thereby raising or lowering the voltage level of the offset calibration signal.

* * * * *